United States Patent [19]
Blake et al.

[11] Patent Number: 5,655,452
[45] Date of Patent: Aug. 12, 1997

[54] METHOD AND APPARATUS FOR AN AUTOMATED PLATE HANDLER WITH SLIP SHEET REMOVAL MECHANISM

[75] Inventors: Laurence S. Blake, Peabody; Philip A. Rombult, Bradford; Libor Krupica, Methuen; David B. Larsen, Woburn, all of Mass.; James C. Folsom, Sanford, Me.; Ross A. Freeman, Somersworth, N.H.; Roger A. Jacques, Rochester, N.H.; Robert S. Ring, Rochester, N.H.; Gerald L. Smith, Dover, N.H.

[73] Assignee: AGFA Division, Bayer Corp., Wilmington, Mass.

[21] Appl. No.: 693,740

[22] Filed: Aug. 7, 1996

[51] Int. Cl.⁶ .................................................. B41F 27/06
[52] U.S. Cl. ...................... 101/477; 101/415.1; 271/900; 414/20
[58] Field of Search .................................. 101/477, 483, 101/415.1, 216, 489; 271/310, 900; 414/14, 15, 16, 20

[56] References Cited

U.S. PATENT DOCUMENTS 4,285,759  8/1981  Allen et al. ................................ 271/20
5,303,647  4/1994  Seo et al. .................................. 101/125
5,469,789  11/1995  Haijima et al. .......................... 101/477

Primary Examiner—Eugene H. Eickholt
Attorney, Agent, or Firm—Julie A. Krolikowski; John A. Merecki

[57] ABSTRACT

The primary function of the optional handler is to make plates available on demand to the imaging engine. A multitude of plates are stored inside cassettes and these cassettes are loaded into the handler. There may be up to four cassettes residing in the handler. Inside a cassette there may be a protective interleaf sheet, sometimes called a slip sheet, between each plate which is removed by the handler and discarded. The handler receives commands from the engine control sequencer which provides instructions as to what cassette needs to be accessed to make a plate available to the picker mechanism so the plate may be conveyed to the imaging engine. Conversely the handler provides status information to the engine to make full interaction with the system possible.

20 Claims, 8 Drawing Sheets

METHOD AND APPARATUS FOR AN AUTOMATED PLATE HANDLER WITH SLIP SHEET REMOVAL MECHANISM

BACKGROUND OF THE INVENTION

Printing processes utilize a vast array of different techologies to transfer written content to various distribution media. Organizations using varying printing process include modest-volume quick printers, book financial publishers, newspaper companies, forms companies, all sizes of commercial printers (for advertising etc.), and, Publication printers (for magazines and periodicals). These types of organizations have a common process whereby information is transferred from some original layout form to an intermediate aluminum or polyester plate material which is then hung on a standard printing press to enable multiple identical replication of that information on paper or some similar print media.

This process has typically been performed by optically creating a polyester film which contains the information, optically transferring the information from the film to a plate material by use of a light transfer or contact to a light-sensitive chemical emulsion which is bonded to the plate, and then hanging the developed plate on a press in alignment (one for each color separation desired). The plates rotate along with the press cylinder and alternately come in contact with ink rollers and then an intermediate transfer blanket. The ink which is accepted by the transfer blanket then transfers the information to the paper during rotational contact.

Recently the development of computer-to-plate, hereafter C2P, systems and processes have provided alternative printing options. The C2P process eliminates the film as an intermediate transfer mechanism and allow the optical exposure of the plate directly. This reduces the number of steps required in the printing process of the information and potentially reduces the cost related to the generation of the intermediate film and its handling. C2P systems more readily allow a process which creates plates for shorter-run printing (below around 50,000 impressions).

In basic terms, a C2P system accepts primarily Postscript input jobs/pages. These jobs are controlled through execution by priority and scheduling workflow software. Jobs are then sent through a raster image processor to a platemaker for exposure. The data is being transformed throughout this process. The platemaker engine takes this data and prints it on a metal sheet of aluminum which is later notched, bent, hung on the press, inked and made ready to image paper. An imaging engine and process for imaging a plate is described in commonly owned U.S. Pat. No. 5,345,870, hereby incorporated by reference into the present application.

The inclusion of a C2P system into a printing operation suggests a greater extent of automation which can be achieved. A full C2P process can automate, through the use of computers and special equipment, the transfer of information from the original layout to the press plate. As such, C2P is not only an improvement in the specialized equipment but also in the process which utilizes that equipment. Viewing C2P as a process includes a high level of workflow management to replace manual effort with computer-driven effort with a goal to increase productivity and efficiency. Workflow encompasses such concepts as queue management, color calibration, revision control, press consumables control, inventory tracking, job and cost tracking, etc.

Also included in the automation of a C2P system is the media handling. It is necessary to supply plates individually from a plate supply area to the platemaker engine and it is desirable to reduce the mount of operator handling involved. Unexposed plates are normally supplied in packages of 25 to 100 with interleaf sheets between the plates for protecting the sensitive emulsion side of the plates, which is extremely sensitive to scratches. The stack of plates needs to be loaded into a supply area of a platemaker in a manner to keep the stack of plates aligned with automation mechanisms for removing a plate from the stack, and for discarding the interleaf sheet from the stack. These functions are optimally performed within a covered light-tight environment to prevent unintentional exposure of the light sensitive plate surface. The platemaker engine requires plates of varying sizes and formats on demand. It is beneficial to present a variety of plate sizes and formats to an automated mechanism for selecting the plate needed by the platemaker engine. It is important to be able to reload the plate supply area without interrupting the operation of the platemaker engine. These functions generally will maximize the output of the platemaker engine, by eliminating time which an operator would manually handle the plates and during which the platemaker engine might be interrupted.

Accordingly it is an object of the present invention to provide an automated C2P system having a workflow software capable of controlling and sequencing the tasks performed by the C2P system from accepting a job input to the system as Postscript and output the job from the system as exposed images on printing plates.

It is a further object of the invention to increase productivity and efficiency in a C2P system by providing automated queue management.

It is a specific object of the invention to automate the operation of supplying plates on demand from a plate storage area within a C2P system to the platemaker engine.

It is a further object of the invention to provide a plate handling mechanism to position a plurality of plate cassettes containing varying plate sizes within the plate storage area, making a desired plate cassette accessible to a plate picking mechanism.

It is another object of the present invention to automatically remove and discard the interleaf sheets from between plates after a plate is individually removed from the stack of plates.

It is another object of the invention to automatically pick a plate from the top of a stack of plates and deliver the plate to the platemaker engine in a manner which accommodates a variety of plate sizes and formats.

SUMMARY OF THE INVENTION

A method for automatically selecting a plate for imaging in an automated plate handler, comprises automatically positioning a plurality of stacks of plates stored in the plate handler to thereby place a stack of the plate size required for an imaging job in an access position. A single plate is automatically separated and removed from the stack of plates in the access position and then transferred the single plate out of the plate handler for imaging. A slip sheet is automatically removed from on top of the stack of plates in the access position.

An apparatus for automatically selecting a plate for imaging in an automated plate handler has a first mechanism for automatically positioning a plurality of stacks of plates stored in the plate handler. The first mechanism places a stack of the plate size required for an imaging job in an access position. A second mechanism is provided for automatically separating and removing a single plate from the stack of plates in the access position and then transferring the single plate out of the plate handler for imaging. Also a third mechanism for automatically removing a slip sheet from on top of the stack of plates in the access position is provided.

BRIEF DESCRIPTION OF THE DRAWINGS

The objects and features of the invention will be better understood and further objects and advantageous of the invention will become apparent in the following detailed description of the invention, when taken with the accompanying drawing(s), in which.

DETAILED DESCRIPTION OF THE INVENTION

Figure 1:
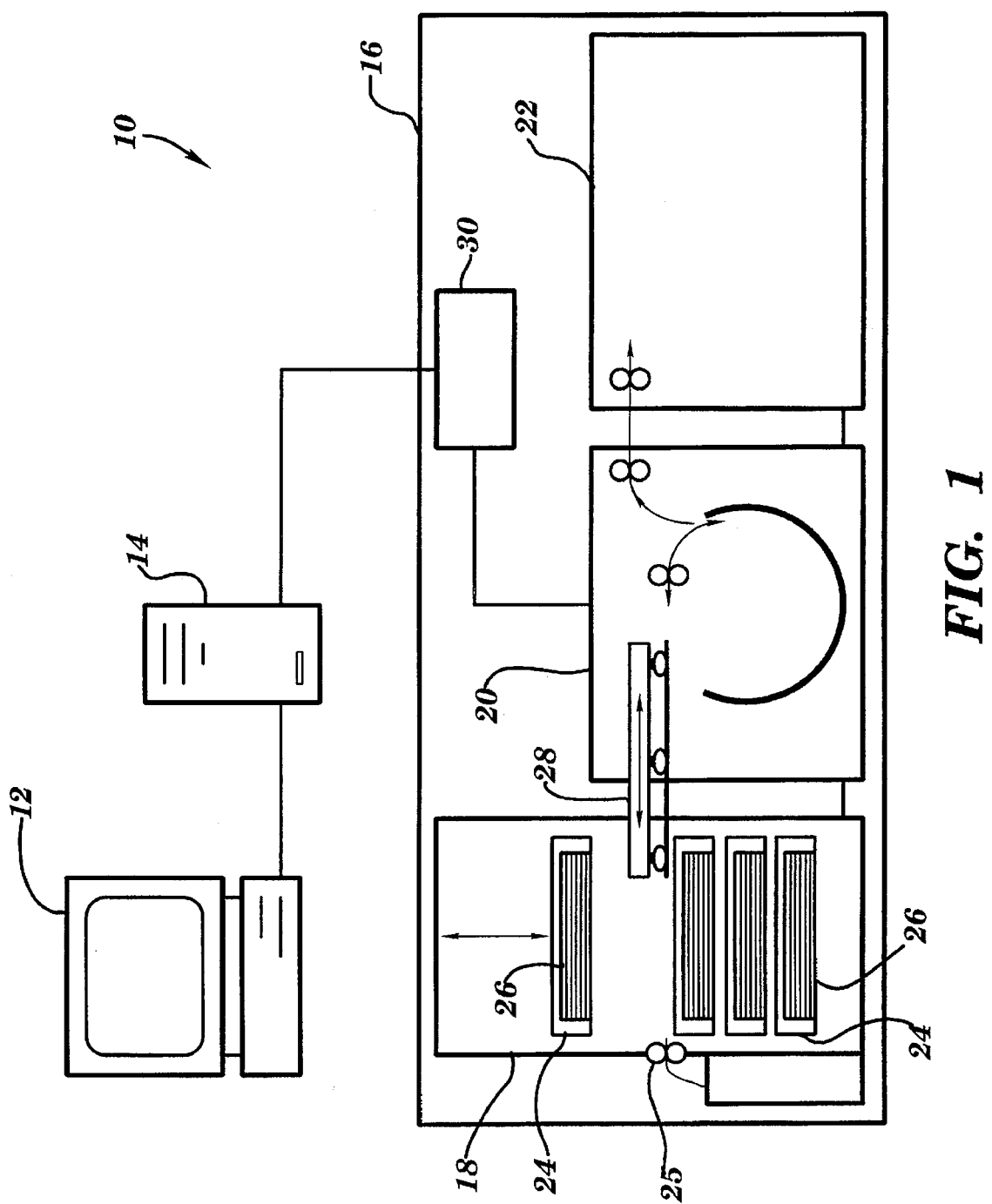
FIG. 1 is a schematic illustration of an electronic prepress system employing a platesetter shown from a side view with a plate handler and plate picker mechanism according to the present invention.

The computer to plate imaging system shown in FIG. 1 and generally referred to as reference number 10, is a complete system for plate production, where digital data files representing a publication (or printed image) are input to the system 10, and plates ready to go on a printing press are output from the system 10. Most of the operation of the system is automated, requiring a minimum of operator intervention. The system is comprised of a front-end server 12, a raster image processor (RIP) 14 and a platemaker or platesetter 16. The front-end 12 sends jobs to the platesetter 16. The platesetter 16 has three major components. An optional on-line plate handler 18, the imaging engine 20 and an optional on-line plate processor/plate stacker 22. The plate handler 18, hereinafter handler, contains a supply of plate containers or cassettes 24. The handler can hold as little as two cassettes or as many as three, four, or five depending on user requirements. Each cassette is a light tight container that houses a stack of plates 26. The cassettes 24 can be vertically adjusted by the handler 18 to make plates 26 stored within a particular cassette available to a plate shuttle mechanism 28, hereinafter referred to as the picker 28. The picker 28 removes a single plate from the selected cassette and transports the plate between the handler 18 and the engine 20, which will be described in detail hereinafter.

The primary function of the handler 18 is to make plates 26 available on demand to the imaging engine 20. A multitude of plates 26 are stacked in each cassette 24 and the cassettes 24 are side-loaded into the handler 18 by an operator. Between each plate in a stack there may be a protective interleaf sheet or slip sheet which is removed by the handler 18 and discarded by a slip sheet removal mechanism 25. The handler 18 receives commands from the engine 20 by workflow software, which provides instructions to the handler 18 about what cassette 26 needs to be accessed to make a plate available to the picker 28 so the plate may be conveyed to the imaging engine 20. The handler 18 in turn provides status information to the engine 20 through the workflow software to make full interaction with the system 10 possible.

The front-end 12 sends data to the engine 20 through an interface connection. Typically this data represents a "job" which requires the imaging of plates. This data contains information about the job's requirements, such as the type of plate, its size and plate thickness, the number of plates that are part of the same job, etc. The engine 20 interfaces electrically with the handler 18 to exchange machine functional and operation data which is input into the workflow software. The handler 18, through the engine 20, sends data to the workflow software from data stored in each loaded cassette 26 representing plate size and quantities available in the cassettes 26. The handler 18 has the capability of reading an ID tag on each cassette which has a description of the plate type inside. This ID tag is in the form of a bar-code or other means. If a required plate size is unavailable, the engine 20 notifies an operator through a platemaker control terminal 30, so the operator can load the needed cassette into the handler 18. The engine 20 passes information to the handler 18 defining the next plate size or thickness required for imaging and which cassette 26 is to be placed in the queue, or in the correct position for access by the picker 28. The cassettes 26 store different sizes and/or thicknesses of plates 26 so the handler 18 positions a specific cassette 24 so that the picker 28 can access the required plate inside the specific cassette. The handler 18 insures the slip sheet, if present, has been removed from the surface of the top plate with the slip sheet removal mechanism 25. The picker 28 then moves over the positioned cassette, the plate is "picked," and the picker 28 returns to the imaging engine (home) position to deliver the plate. The imaging engine 20 accepts the plate and while the picker is in the engine 20 in the home position, the handler 18 is free to position the cassettes 24 in preparation for the next plate to be imaged.

Figure 2:
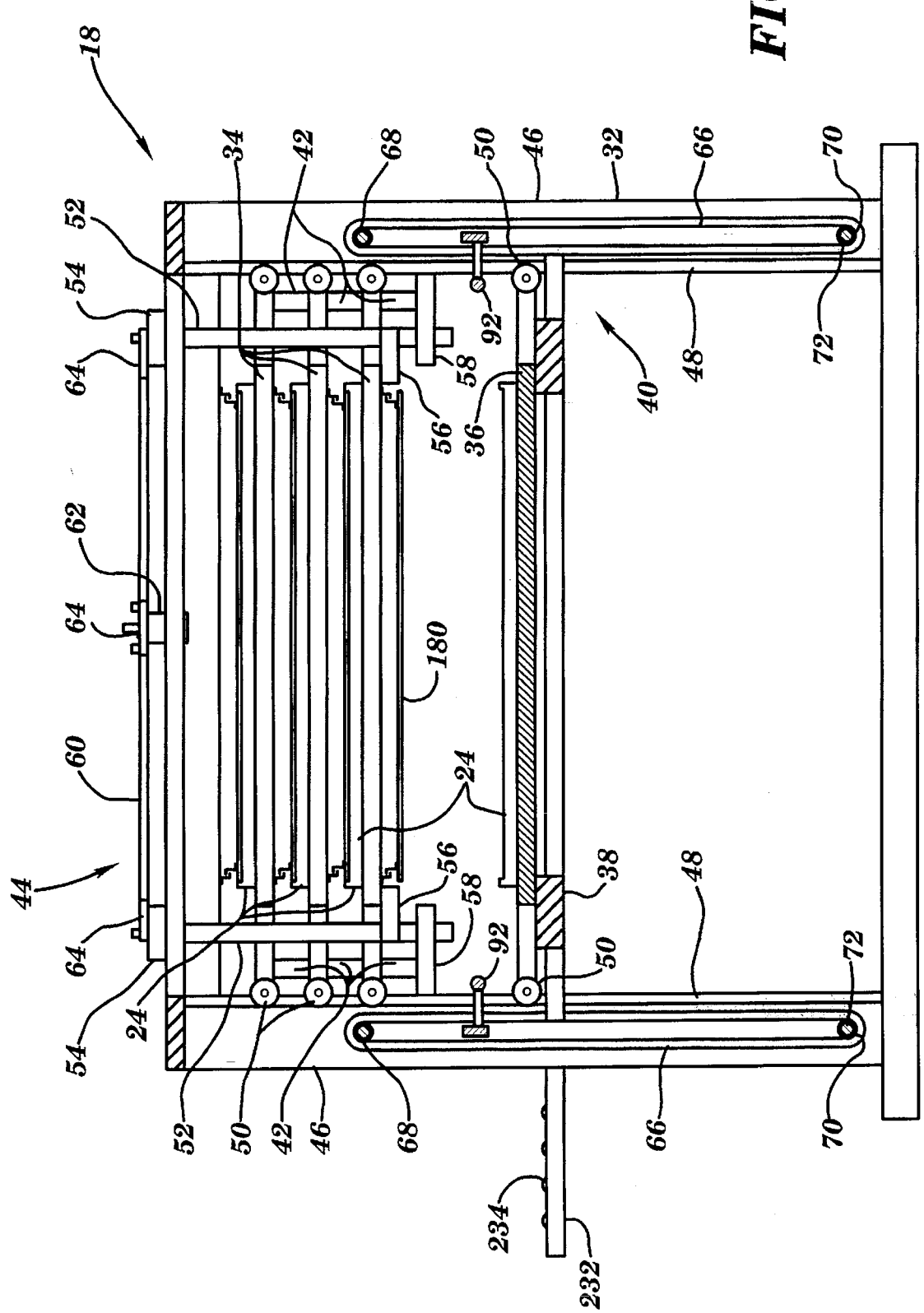
FIG. 2 is a partial sectional front view of the plate handler viewed in FIG. 1.

Referring to FIG. 2, some basic elements of the handler 18 are shown. The handler 18 has a support frame 32 which surrounds several tables 34, 36. The lowermost table 36 is attached to and supported by a brace 38 on the underside of the lowermost table 36. The brace 38 is attached to an elevator mechanism, referred to generally as 40 and to be described hereinafter, which raises and lowers the brace 38 and the lowermost table 36 supported by the brace 38. The upper three tables 34 positioned above the lowermost table 36 rest upon the lower table 36 on table spacers 42 which are secured to the outer ends of the undersides of the upper three tables 34. In FIG. 2, the upper three tables 34 are shown being supported by a table support mechanism, referred to generally as 44 and to be described hereinafter, which separates the tables to allow clearance space for the picker to enter into above the cassette from which a plate is going to be picked. When the table support mechanism 44 is inactive, the table spacers 42 contact the table immediately below the table which the spacers are attached to, in a manner so as to support that table. The tables 34, 36 can be positioned by the elevator mechanism 40 as a group, with the three upper tables 34 resting on the lowermost table 36 on the brace 38 of the elevator mechanism 40.

Figure 3:
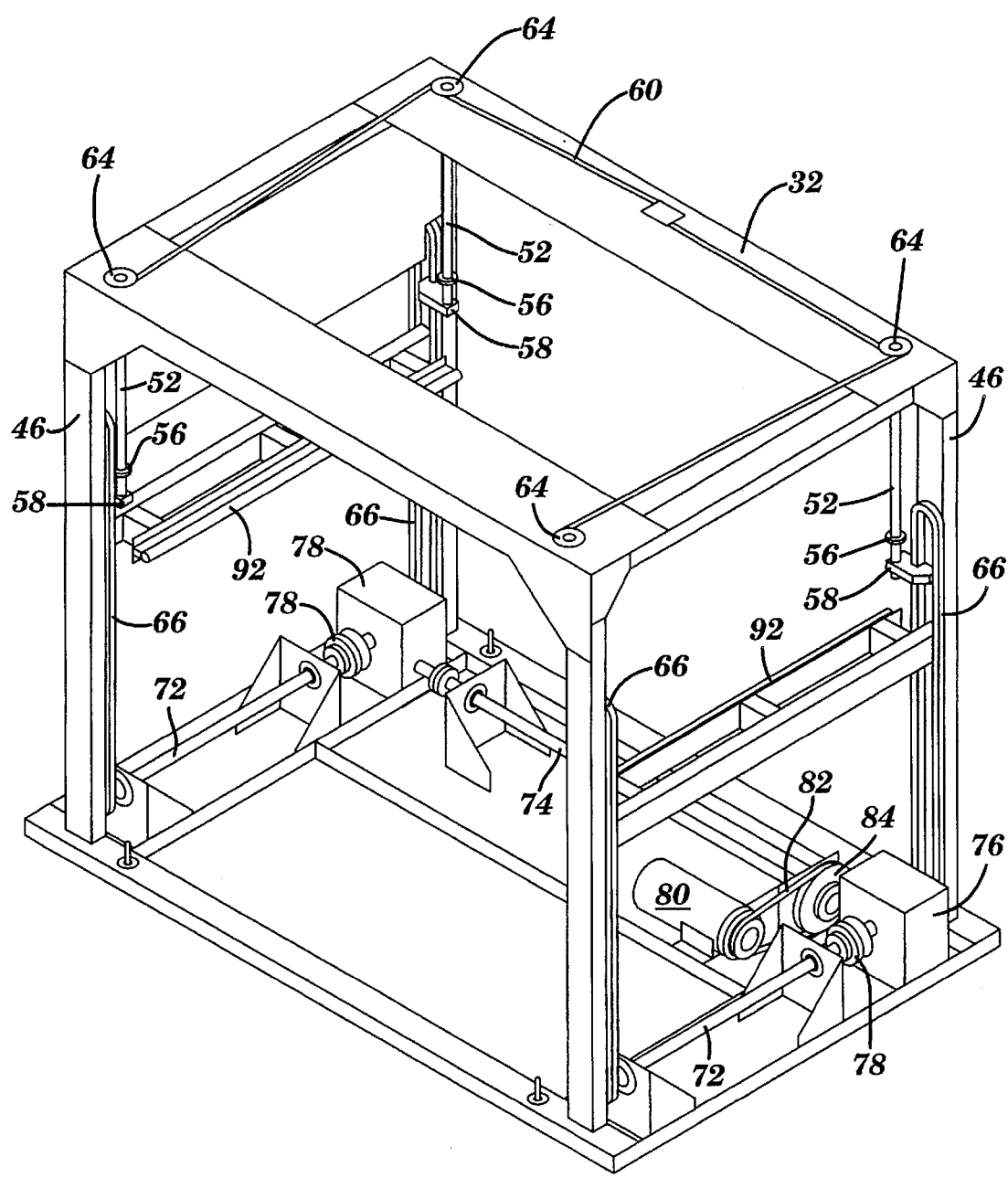
FIG. 3 is an isometric view of an assembly portion of the plate handler shown in FIG. 2, particularly featuring an elevator mechanism and a table supporting mechanism according to the present invention.

Referring additionally to FIG. 3, the support frame 32 has four vertical support beams 46 provided with guide tracks 48 for guiding the tables while being raised or lowered. Each table has four rotatable guide wheels 50 (only two shown as viewed in FIG. 2) which ride in the guide tracks 48 at the corners of each table. The table support mechanism 44 comprises four vertical shafts 52 with bearing mounts 54 at the upper ends of each shaft 52. The shafts 52 are rotatable relative to the bearing mounts 54 which are attached to the topside of the support frame 32. The support frame 32 has bores (not shown) which the shafts pass through to extend downward to the tables 34, 36. At the lower ends of the shafts 52 are support bars 56 which protrude horizontally outward from the shaft 52 at a right angle therefrom, and lower bearing mounts 58 attached to the four vertical support beams 46. In an inactive position, the support bars 56 face outward and away from the tables, as shown in FIG. 3. A linkage 60 connecting the shafts 52 transmits rotary motion from a drive motor 62 to rotary plates 64 fixed to the tops of each shaft 52 and to the shaft of the drive motor 62. Upon a predetermined rotation by the drive motor 62, the linkage 60 connecting the rotary plates causes the four shafts 52 to rotate 90 degrees, positioning the horizontal support bars 56 facing inward toward the tables, in the active position as in FIG. 2. The support bars 56 are in position to support the tables 34 above the cassette 24 to be accessed by the picker 28.

The elevator mechanism 40 comprises a chain drive system having four chain drives 66, one mounted on each support beam 46. Two rotatable sprockets 68, 70 are mounted on each support beam 46 in an upper and lower position to cooperate with the chains 66 and transmit rotary motion of the sprockets 68, 70 into linear motion of the chains 66. The lower sprockets 70 are attached to two horizontal shafts 72 which transmit rotary motion from a main drive shaft 74 through several gear boxes 76 and couplings 78. The main drive shaft 74 is powered by a drive motor 80 through a belt 82 and pulley 84 connection.

The brace 38 is connected to the chains 66 on the inner sides of the support beams 46 so that upon rotation of the drive motor 80, the chain drive system raises or lowers the brace 38, the lowermost table 36, and any upper tables 34 resting thereon which are not supported by the table support mechanism 44 at the time.

Figure 4:
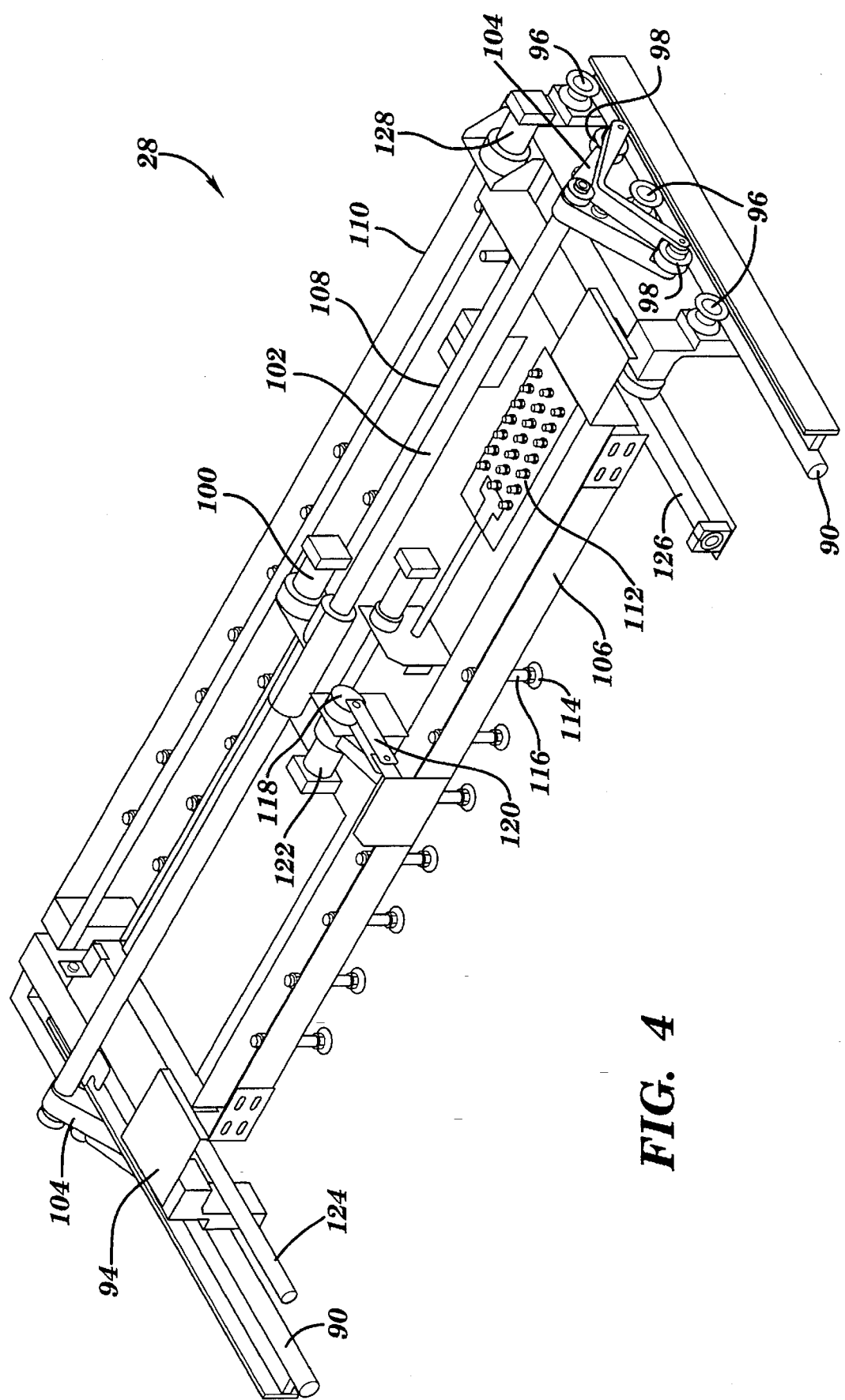
FIG. 4 is a detailed isometric view of the plate picker mechanism shown in FIG. 1.

Referring now to FIG. 4, the picker 28 is shown supported on parallel rails 90 which are fixed to the interior of the engine compartment 20 (FIG. 1). Complementary rails 92 are mounted inside of the handler 18 as shown cross section in FIG. 2 and isometrically in FIG. 3, allowing the picker to move smoothly between the engine 20 and handler 18. The rafts 92 inside the handler are secured to the support beams 46 of the handler frame 32. The picker 28 has a carriage 94 which is supported on the rails (90 or 92 depending on whether the handler is in the engine or the handler respectively) by three guide wheels 96 which engage the rails 90 (or 92) on each side of the carriage 94. Also two friction wheels 98 engage the rails 90 (or 92). The friction wheels 98 are driven by a motor 100 mounted on the carriage 94 through a connection to a drive shaft 102 and a belt and pulley mechanism 104 on each side of the carriage 94. The motor 100 operates in two directions to effectively propel the picker carriage 94 in forward and reverse from the engine compartment 20 to the handler 18. The carriage 94 supports three rows 106, 108, 110 of suction cups and an associated vacuum manifold 112 and vacuum tubing (not shown) between the manifold 112 and the three rows 106, 108, 100 of suction cups. The suction cups 114 are mounted on spring loaded fittings 116 to allow compression of the suction cups 114 against a plate during picking to ensure attachment of the plate to the picker 28. The first row 106 of suctions cups that extends the furthest into the handler 18 is pivotable with respect to the carriage 94. An eccentric drive 118 and linkage 120 pivots the first row 106 of suction cups in a "peeling" motion. The eccentric 118 is driven by a motor 122 mounted on the carriage 94 to break or peel the edge of the plate being picked away from the stack. The middle row 108 of suction cups remains fixed with respect to the picker carriage 94. The third row 110 of suction cups slides out from the middle row 108 of suction cups. Two circular rails 124, 126 are mounted for sliding through complementary bearings (not shown) in the carriage body 94 on the both sides of the picker 28. On the right side of the picker viewed in FIG. 4, the circular rail 126 has a friction drive wheel (not shown) is in driving contact with the circular rail 126. The drive wheel is driven by a drive motor 128 through a belt and pulley mechanism (not shown), all of which are mounted to the carriage body 94 so as to transmit rotary motion of the drive wheel into linear motion of the circular rails 126, 124 relative to the carriage body 94. The third row 110 of suction cups being movable relative to the other rows 106, 108 of suction cups expands the overall size of the picker 28 and the coverage area of the suction cups 114 to accommodate for various sized plates.

Figure 5:
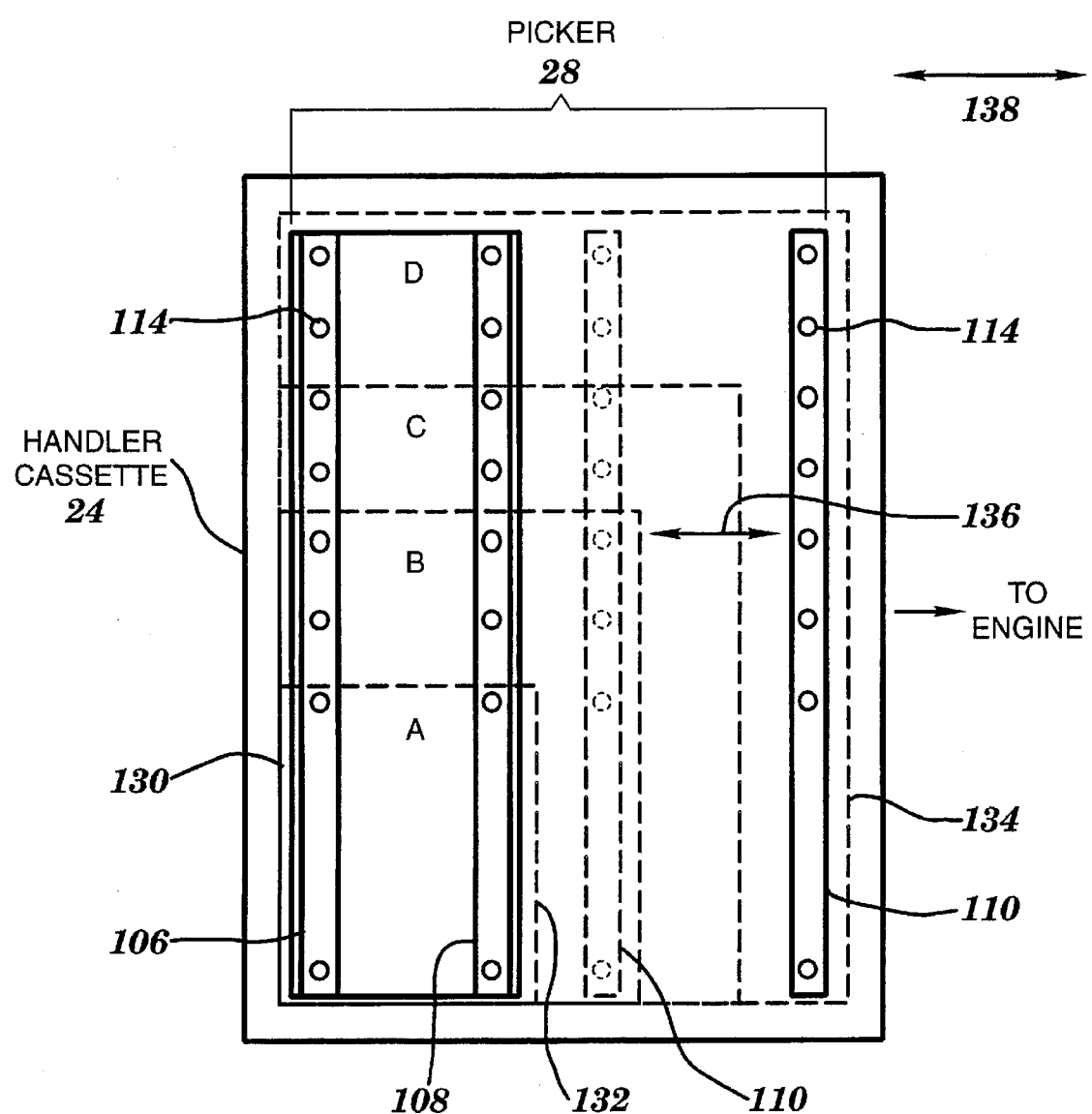
FIG. 5 is a simplified top view of the picker mechanism of FIG. 4 positioned over a handler cassette within the plate handler according to the present invention.

FIG. 5 illustrates a simplified top view of the picker 28 positioned over a cassette 24 in the handler. The first row 106 of suction cups 114 is positioned near an inner edge 130 of the cassette 24 against which the plates are referenced regardless of the plate size. Four different plates having different sizes are depicted by dashed lines and are indicated as plates A, B, C, and D. Plate A is the smallest plate and the middle row 108 of suction cups of the picker 28 is positioned near the opposite edge 132 of plate A from the reference edge 130. The middle row 108 has a fixed position relative to the first row 106 (excepting that the first row is pivotable) to pick up plate A without the use of the third row 110 of suction cups. The third row 110 is shown in an extended position by solid lines, at the far edge 134 of the largest plate D opposite from the reference edge 130. The third row 110 of suction cups is also shown by dashed lines in a non-extended position. The third row 110 of suction cups is used to expand the size of the picker 28 to cover the areas for various size plates, such as B, C, and D, larger than the smallest plate A and smaller than or equal to the largest plate D, as indicated by arrow 136. Arrow 138 shows the relative movement of the picker 28 including all three rows 106, 108, 110 of suction cups 114 with respect to the handler cassette 24 and the engine.

Figure 6:
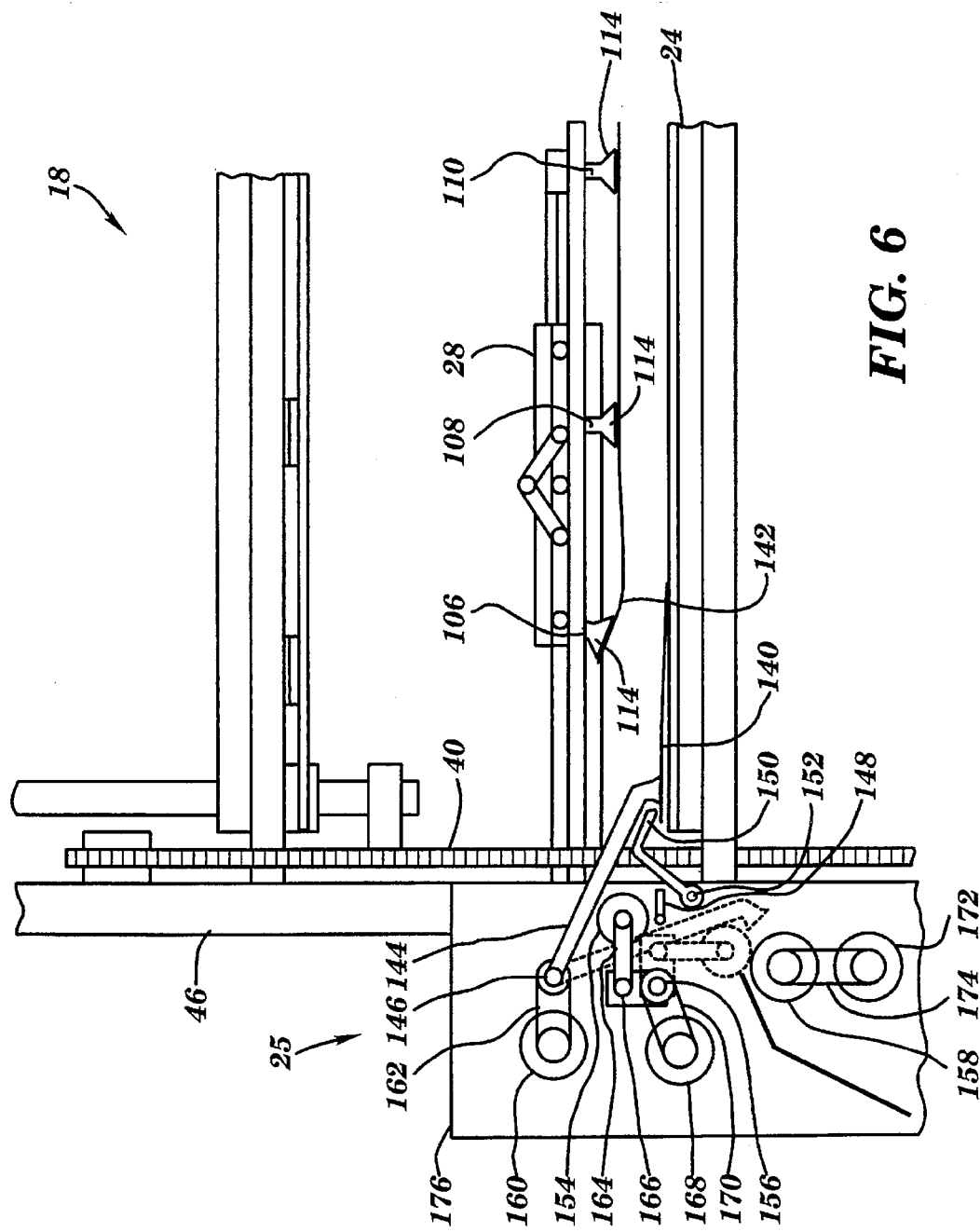
FIG. 6 is a side view of a portion of the plate handler showing the plate picker in the process of picking a plate from a cassette, and also featuring a slip sheet removal mechanism according to the present invention.

Referring now to FIG. 6, the slip sheet removal mechanism is generally indicated as 25. The mechanism 25 is for the purpose of preventing a slip sheet 140 from sticking to the bottom of a plate 142 which is attached to the picker 28, securing the slip sheet 140 on the top of the stack of plates in a cassette 24 to the slip sheet removal mechanism 25, and subsequently completely removing the slip sheet 140 from the stack of plates in the cassette 24. The mechanism 25 comprises a plurality of suction tubes 144 mounted on a first pivotable shaft 146, an optional peeler air blast 148, a plurality of fingers 150 mounted on a second pivoting shaft 152, a plurality of nip wheels 154 mounted on a third pivoting shaft 156 (only one of each seen in drawing due to side view), and a rotatably driven roller 158 positioned below the nip wheels 154 which are in rolling contact during part of the slip sheet removal process, to be described hereinafter. The suction tubes 144 are fixed to the pivoting shaft 146 to pivot upon being driven by motor 160 through a drive belt and pulley connection 162. The fingers 150 are fixed to pivoting shaft 152 which is driven by a similar drive connection to a motor (not shown). The nip wheels 154 are each mounted to an extension arm 164 which is attached to a bracket 166 mounted on the pivoting shaft 156. The extension arm 164 is spring loaded at the connection to the bracket to allow for the extension arm 164 to pivot or give slightly while pressure is applied between the nip wheel 154 and the roller 158. The shaft 156 is rotated in forward and reverse by the drive motor 168 through a drive belt and pulley connection 170. The roller 158 is driven by a motor 172 also through a belt and pulley connection 174. It will be understood by those skilled in the art that equivalent means for rotating the pivoting shafts 146, 152, 154, and rotating roller 158, may be substituted therefor without departing from the spirit of the invention. The driven shafts and motors for driving the shafts are all mounted to a mounting bracket 176 which is connected to the support beams 46 of the handler 18. Operation of the slip sheet removal mechanism 25 will be described hereinafter.

Figure 7:
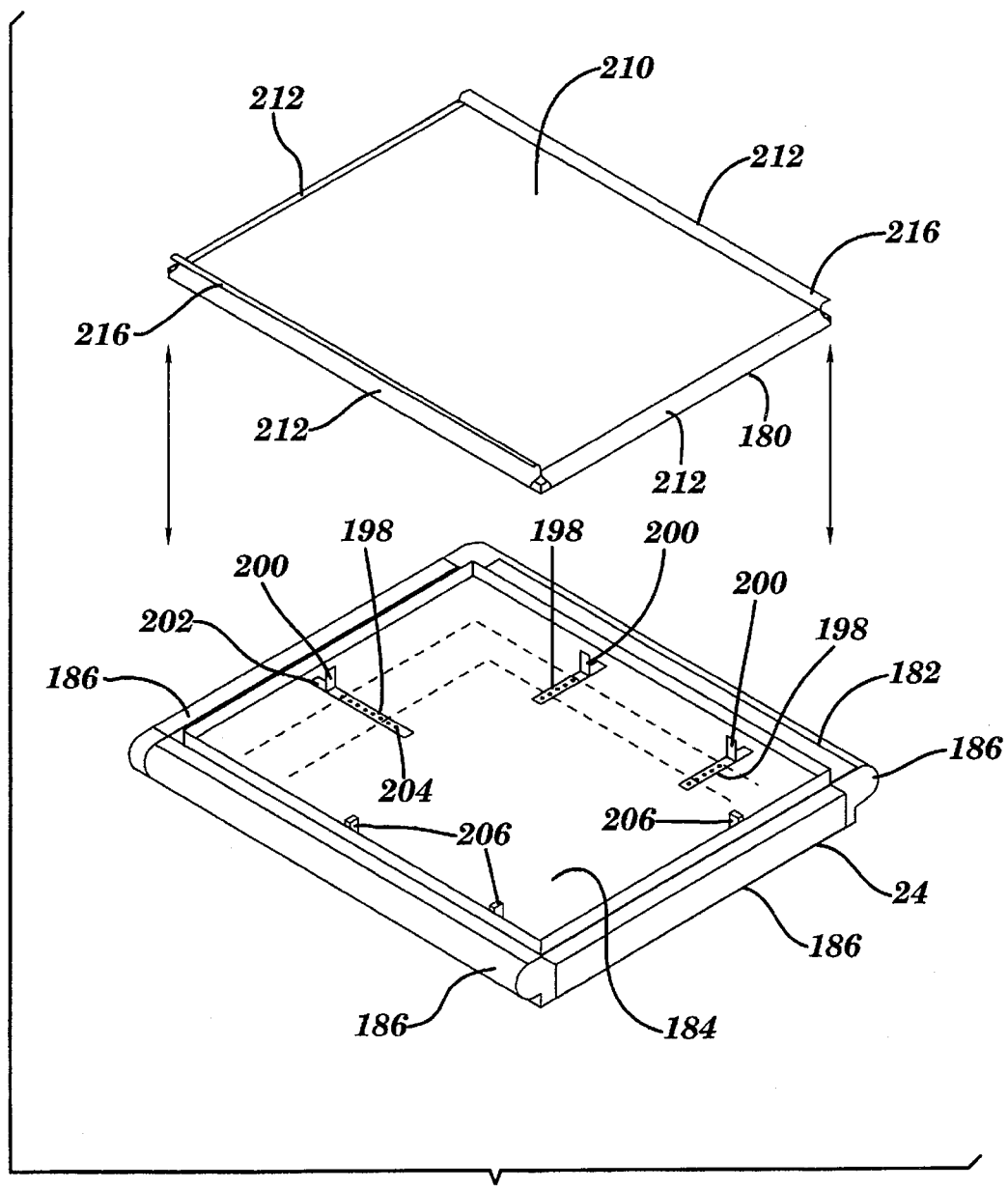
FIG. 7 is an isometric view of a plate cassette used in the plate handler according to the present invention.
Figure 8:
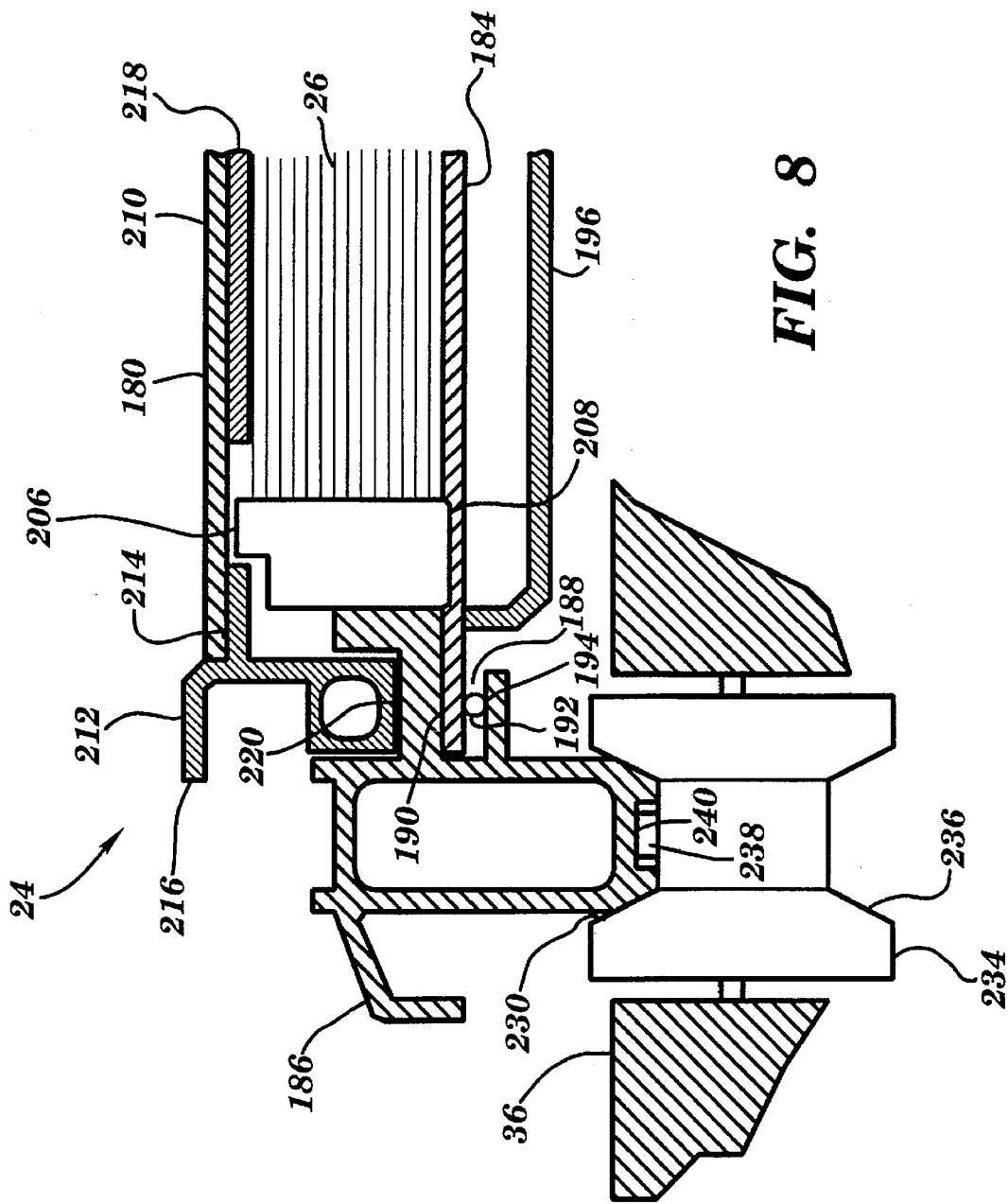
FIG. 8 is a detailed side sectional view of a portion of a plate cassette as shown in FIG. 7.

Referring now to FIG. 7 and FIG. 8, a cassette 24 for loading into the plate handler is shown. The cassette has a removable cover 180, which is removed and replaced in a vertical direction relative to a rectangular bottom container 182 as indicated by arrows. The bottom container 182 comprises a base plate 184 surrounded by four aluminum side extrusions 186. The extrusions 186 are attached at the four 90 degree corners by spring clips and adhesive (not shown). The base plate 184 is contained within a slot 188 in the edge of each extrusion 186 and is held in place with an adhesive on the top side 190 of the base plate 184 and a piece of continuous round flexible urethane belting 192 on the bottom side of the base plate 184. The round belting 192 is retained in a thin groove 194 provided in the extrusion 186.

Three channels 196 (one shown) are fastened to the bottom side of the base plate 184. The channels 196 act as reinforcing stiffeners for the bottom container 182, and also are housings for three locator bars 198. Each locator bar 198 is attached within a channel 196 by an adhesive. An adjustable stop 200 is provided on each locator bar 198 to slide along the locator bar and be fastened to a set position by a lock screw 202 which screws into holes 204 drilled into the locator bars 198. The three adjustable stops 200 locate and secure a stack of plates 26 against several reference blocks 206 fastened to the side extrusions 186. The adjustable stops 200 allow multiple sizes of plates 26 to be held against the reference blocks 206 within a single bottom container 182. The base plate 184 is provided with embossed areas 208 for the reference blocks 206 to be set within, which prevents the plates referenced against the reference blocks 206 from sliding between the reference block 206 and the base plate 184 and maintaining alignment of the plates with respect to the reference block 206.

The cover 180 comprises a top plate 210 and four side extrusions 212 surrounding the top plate 210. The extrusions 212 are fastened together at the four corners of the top plate 210 by spring clips and adhesive (not shown). The top plate is secured to a ledge portion 214 of the extrusions 212 by an adhesive. Two of the four side extrusions have a handle portion 216 formed in the extrusion 212 which cooperate with hooks on the undersides of the cassette tables in the handler to remove and replace the cassette cover (to be described hereinafter). The inside of the top plate 210 has a layer of foam 218 attached, to ensure that the plates on the top of a full stack of plates 26 do not slide over the tops of the reference blocks 206 during loading of a cassette 24 into the handler 18. The cover 180 and the bottom container 182 are constructed are constructed from light proof materials, so that when the plates are enclosed within a covered cassette, there is no exposure of the light sensitive plate contained within the cassette. The attachment area between the bottom extrusions 186 and the cover extrusions 212 has magnetic strips 220 which ensure the cover 180 is attached securely to the bottom container 182 and that no light will enter the cassette 24 during handling.

The side extrusions 186 are provided with a beveled portion 230 which aid in the loading of the cassette 24 into the plate handler 18. The handler 18 has a loading platform 232 shown in FIG. 2, extending horizontally from the vertical beams 46 of the handler. The loading platform 232 has rows of grooved wheels 234 mounted for rotation within the loading platform 232. The grooved wheels 234 cooperate with the beveled portion 232 of the side extrusions 186 of the cassette 24 during loading and serve to register the cassettes in a reference position within the handler. All tables 34 and 36 within the handler are also provided with the rows of grooved wheels to facilitate smooth and easy loading of the cassette from the loading platform onto the support tables in the handler, while maintaining the cassette in register. The beveled portions 230 cooperated with the V-grooved surface 236 of the grooved wheels 234 on opposite outer sides of the cassette 24 for proper alignment. The cassette is designed to align the plates inside the cassette against the reference blocks provided on the interior of the cassette, and also register the cassette into a reference position within the handler, as shown in FIG. 5, regardless of the plate size contained in the cassette. The parallel rafts 92 in the handler are fixed relative to the wheels of the selected table in the access position. This ensures the registration of the plates within the cassette relative to the rafts 92, and the registration is transferred to the complementary rafts 90 in the engine compartment, and thereby the plate is delivered in register into the engine from the handler.

Additional locator stops 238 are provided on each table to assist in registering the cassette 24 in the loading direction so that the cassette 24 is pushed into the handler 18 along the grooved wheels 234 of the table 36, but only to a predetermined location so that the cassette 24 is registered with respect to two dimensions and to the picker rails 92. These additional locator stops 238 are spring loaded and are located between the grooved wheels 234 within each row of grooved wheels on a table 36. The stops 238 contact an underside 240 of the side extrusions 186 while the cassette 24 is being loaded, and when the stop 238 comes into contact with a recess (not shown) formed in the underside of the extrusion, the spring force behind the stop 238 forces the stop into the recess and locks the cassette 24 the predetermined on the table. The wheels 234 register the cassette with respect to the two reference blocks 206 on one side of the cassette, while the locator stops 238 within the rows of the wheels 234 register the cassette 24 with respect to the third, alone reference block 206 on the neighboring side of the cassette. Then the plates are registered in a known location relative to the picker, as depicted in FIG. 5.

The loading platform can be incorporated into the design of the doors and covers for enclosing the handler in a light tight environment. The loading platform can function both as a door into the cassette loading area, and as the loading platform. This is accomplished by providing an attachment hinge on the handler frame for the loading table to pivot between the two functional positions. The loading table is pivoted up for a closed door position, and down and horizontally as shown in the figure for an open, cassette loading position.

Cassettes loaded into the handler house the plates. At any one time, a cassette holds only like plates (same type, gauge, size, etc.). Typically, there is a maximum of 50 plates of 0.012" gauge, 75 plates of 0.008" gauge, or 100 plates of 0.006" gauge, in a single cassette. There are several distinct cassette sizes. A cassette of a specific size holds a range of plate sizes inside, however only one size plate is loaded into a cassette at any one time. Fillers or guides are used to take-up the space between plate and cassette boundaries. The reference position of the plates within the cassette is described above with reference to FIG. 5. Packaging of plates within a cassette is related to both handler operation and cassette transportability. There may be a mix of cassettes in the handler (two, three or four cassettes). All cassettes can be different from each other, in that each houses a distinct set of plate characteristics (type, size, gauge, etc.) There may be instances where some or all cassettes inside the handler have the same plate characteristics.

Now, with reference to all the Figures, the method for using the plate handler 18 and picker 28 will be described. The primary function of the handler 18 is to position a required plate on demand in an access position for the picker 28, which picks and delivers the required plate to the engine 22. Once the handler 18 receives a request from the engine 22 for a specific plate, the following actions take place in the handler, in cooperation with the engine 20. The picker 28 begins in the home position within the engine 20. The slip sheet removal mechanism 25 is positioned with the suction tubes 144, fingers 150, and nip wheels 154 retracted (as shown in dotted lines for the suction tubes and nip wheels in FIG. 6) to clear the path of the tables 34, 36 for repositioning by the elevator mechanism 40. The elevator mechanism 40 moves the brace 38, lower table 36, and upper tables 34 supported thereon, if any, to a cover removal/replacement position in the cover removal/replacement position, the selected table 36 is located directly below the table 34 supported by the support bars 56 of the table support mechanism 44. Hooks on the bottom of the supported table 34 engage the cover 180 of the selected cassette 24 for either removal or replacement, so that the cover 180 is separated from or rejoined with the selected cassette 24.

In FIG. 2, the cover removal/replacement position for the lower table 36 is at a position where the open cassette 24 on the lower table 36 contacts the cover 180 supported by the table 34 immediately above the lower table 36 held by the support bars 56. When the selected cassette 36 is in the cover removal/replacement position, the upper tables 34 are all then supported by the brace 38. Then the support bars 56 and shafts 52 are turned 90 degrees by means of the linkage 60 and drive motor 64. Once the support bars 56 are retracted from the path of motion of the tables 34, 36, the elevator mechanism 40 moves to the cover removal/replacement position for the next selected table and cassette. The table support mechanism 44 moves the support bars 56 into the supporting position underneath the table directly above the selected cassette 24. The elevator mechanism 40 then moves the selected table down thereby separating the cover 180 of the selected cassette 24 from the selected cassette 24 so that the picker can access the plates 26 contained within the cassette 24.

The picker 28 is then moved from the home position in the engine 20 into the handler 18 along the rails 90 and 92. Depending on the size of the plate in the selected cassette 24 the picker 28 adjusts the third row 110 of suction cups relative to the middle row 108 of suction cups to accommodate for various plate sizes, if necessary (FIG. 5). The elevator mechanism 40 moves the selected cassette 24 and plates therein upward to come into contact with the suction cups 114 on the picker 28 (FIGS. 4 and 6). The suction cups 114 retract into the spring loaded fittings 116 to accommodate for variations in the stack height of the plates 26 in the cassettes 24, as the elevator 40 moves the cassette 24 up to the picking position which is at a set vertical height relative to the picker rafts 90b, 92b. Therefore for a maximum stack height of a full stack of plates, the suction cups 114 compress against the spring loaded fittings 116 and retract a length into the fittings, and for a depleted stack of plates, the suction cups 114 compress against the spring loaded fittings and retract substantially the same length minus the height of the stack depletion. The spring loaded fittings 116 also ensure that the plate and the suction cups 114 make contact to secure the plate onto the picker 28. After the plate is attached to the picker 28 by the vacuum suction, the first row 106 of suction cups on the picker 28 is pivoted upward, peeling back the edge of the plate 142 and creating a gap between the plate 142 and the slip sheet 140 underneath.

The slip sheet removal mechanism 25 activates the peeler air flow 148, and the fingers 150 are pivoted into position to hold down the edge of the slip sheet 140 while the elevator mechanism 40 lowers the cassette 24 to a slip sheet removal position. The peeler air blast 148 remains on while the cassette 24 moves downward to separate the slip sheet 140 from the bottom of the plate 142 being picked by the picker 28, which may stick to the plate due to electrostatic charge. The fingers 150 are pivoted away from the slip sheet 140 and the suction tubes 144 are pivoted into position above the slip sheet edge. The suction cups on the ends of the suction tubes are compliant and flexible so that when the vacuum is applied and contact is made between a suction cup and the slip sheet, the slip sheet material is drawn into the suction cup and the separation of the slip sheet from the plate below it is initiated. The compliant suction cup deforms to break the slip sheet away from the lower plate as typically an attractive force exists between the slip sheet and the plate. This is also an important step in the process of removing the slip sheet because the slip sheet may be a porous material and the vacuum applied through the suction tubes can pass through the slip sheet material and be applied to the plate below, which is undesirable when attempting to remove the slip sheet. The selected cassette 24 is elevated to bring the slip sheet 140 into contact with the suction tubes 144 while the vacuum is on. The suction tubes 144 pivot upward slightly to break the adhesion of the slip sheet 140 to the plate below. The elevator 40 then moves the selected cassette 24 downward from the slip sheet removal mechanism 25 and the suction tubes 144 pivot back downward to the roller 158 with the slip sheet 140 attached. The vacuum for the suction tubes 144 is turned off and the slip sheet 140 is released to the rotating roller 158 to pull the slip sheet 140 away from the stack. The nip wheels 164 pivot from the position shown in solid lines to the position shown in dotted lines to cooperate with the roller 158 and remove the slip sheet 140. A sensor (not shown) indicates that the removal of the slip sheet 140 is completed and the rotating roller 158 is then halted. Meanwhile the picker 28 lowers the first row 106 of suction cups from the peeling position, and the picker 28 travels back into the engine 22 to the home position. For the next plate to be selected by the picker 28, the steps are partially repeated if the same cassette 24 is being picked from, or the steps are repeated from the beginning of the sequence for another cassette.

In order to load cassettes into the handler, the following method steps occur in conjunction with the plate handler apparatus and the workflow software as described previously. The handler has sensors positioned appropriately (not shown) to monitor the level of the plates contained in each cassette. Additionally the handler has the capability of knowing the types of plates available so that when a plate needed by the engine is not available, or upon a sensor detecting an empty cassette, a signal is communicated to the engine and the operator is alerted through the operator control terminal 30.

The picker 28 is returned (if not already there) to begin in the home position within the engine 20. The slip sheet removal mechanism 25 is positioned with the suction tubes 144, fingers 150, and nip wheels 154 retracted (as shown in dotted lines for the suction tubes and nip wheels in FIG. 6) to clear the path of the tables 34, 36 for repositioning by the elevator mechanism 40. The elevator mechanism 40 moves the brace 38, lower table 36, and upper tables 34 supported thereon, if any, to the cover removal/replacement position previously described. Then the support bars 56 and shafts 52 are turned 90 degrees by means of the linkage 60 and drive motor 64. Once the support bars 56 are retracted from the path of motion of the tables 34, 36, the elevator mechanism 40 moves to the cassette loading position for the selected table and cassette needing replacement. The cassette loading position is located where the selected table is adjacent to the loading platform 232 shown in FIG. 2 extending out from the handler 18 to support the cassette 24 to slide horizontally between the selected table and the loading platform 232 during loading and unloading. Covers and doors (not shown) are provided to enclose the entire handler frame to maintain the cassette in a light tight environment. The doors are provided to access the interior of the handler and at this time the door locks are released to allow operator access. Then the empty cassette is removed by sliding the cassette out horizontally in along the path formed by the grooved wheels in the selected table and the loading platform, and then the cassette is either reloaded or replaced with another cassette. The cassette presence is monitored by sensors. After detecting the cassette on the selected table, the handler waits for the doors to be closed and then the door locks are activated. The elevator moves up to the cover removal/replacement position for the selected cassette and normal operation is resumed.

It will be understood that the preferred embodiment of the system described herein being a platesetter for imaging aluminum plates, can be used also with polyester plates, can be modified to perform as a proofing device rather than a platesetter, such as in commonly owned, pending U.S. application Ser. No. 08/496,714, entitled "Electronic Prepress System With Multi-Function Thermal Imaging Apparatus," hereby incorporated by reference. Additionally the apparatus described herein is applicable to production of thermally recorded printing plates as well as photosensitive lithographic printing plates recorded by light exposure, with various modification to the system's processing and imaging components, as appreciated by those familiar with the art.

While this invention has been described in terms of various preferred embodiments, those skilled in the art will appreciate that various modifications, substitutions, omissions and changes may be made without departing from the spirit thereof. Accordingly, it is intended that the scope of the present invention be limited solely by the scope of the following claims, including equivalents thereof.

We claim:

1. A method for automatically selecting a plate for imaging in an automated plate handler, comprising the steps of:

a. automatically positioning a plurality of stacks of plates stored in the plate handler and placing a stack of the plate size required for an imaging job in an access position;

b. automatically separating and removing a single plate from the stack of plates in the access position and transferring the single plate out of the plate handler for imaging; and c. automatically removing a slip sheet from on top of the stack of plates in the access position.

2. The method according to claim 1, wherein said step of automatically removing the slip sheet is performed by a slip sheet removal mechanism, and said step comprises:

a. preventing the slip sheet from sticking to the bottom of the single plate during transfer of the single plate out of the plate handler;

b. securing the slip sheet to the slip sheet removal mechanism; and c. completely removing the slip sheet from the stack of plates.

3. The method according to claim 2, wherein the step of securing the slip sheet to the slip sheet removal mechanism includes moving the stack of the plate size required so that the slip sheet on the top of the stack is in contact with suction tubes on the slip sheet removal mechanism.

4. The method according to claim 2, wherein said step of securing the slip sheet to the slip sheet removal mechanism includes applying vacuum through at least one suction tube on the slip sheet removal mechanism and making contact between the suction tube and the slip sheet.

5. The method according to claim 1, wherein said step of automatically removing a slip sheet includes the step of gripping the slip sheet and initiating separation of the slip sheet from a plate next to the slip sheet.

6. The method according to claim 5 wherein the step of gripping the slip sheet and initiating separation of the slip sheet is performed by at least one compliant suction cup having vacuum applied inside the suction cup.

7. The method according of claim 1, wherein the step of automatically separating and removing the single plate comprises the steps of:

a. positioning a carriage at the stack of plates in the access position;

b. attaching the single plate to the carriage; and c. moving the carriage from the access position out of the plate handler.

8. The method according to claim 2, wherein the step of preventing the slip sheet from sticking to the bottom of the single plate includes holding the slip sheet against the top of the stack of plates by pivoting a finger member into a holding position while the single plate is transferred out of the plate handler.

9. The method according to claim 8, further including the step of moving the stack of plates away from the access position as the single plate is transferred out of the plate handler.

10. An apparatus for automatically selecting a plate for imaging in an automated plate handler, comprising:

a. means for automatically positioning a plurality of stacks of plates stored in the plate handler and placing a stack of the plate size required for an imaging job in an access position;

b. means for automatically separating and removing a single plate from the stack of plates in the access position and transferring the single plate out of the plate handler for imaging; and c. means for automatically removing a slip sheet from on top of the stack of plates in the access position.

11. The apparatus according to claim 10, wherein said means for automatically removing the slip sheet from the top of the stack includes means for gripping the slip sheet and initiating separation of the slip sheet and a plate next to the slip sheet.

12. The apparatus according to claim 11, wherein said means for gripping the slip sheet and initiating separation of the slip sheet from the plate next to the slip sheet comprises means for applying vacuum through at least one suction tube on the slip sheet removal mechanism and means for making contact between the suction tube and the slip sheet.

13. The method according to claim 10, wherein said means for automatically removing a slip sheet includes means for gripping the slip sheet and initiating separation of the slip sheet from a plate next to the slip sheet.

14. The method according to claim 13 wherein the means for gripping the slip sheet and initiating separation of the slip sheet includes at least one compliant suction cup having vacuum applied inside the suction cup.

15. The apparatus according to claim 10, wherein said means for automatically removing the slip sheet is a slip sheet removal mechanism, comprising:
  a. means for preventing the slip sheet from sticking to the bottom of the single plate during transfer of the single plate out of the plate handler;
  b. means for securing the slip sheet to the slip sheet removal mechanism; and
  c. means for completely removing the slip sheet from the stack of plates.

16. The apparatus according to claim 15, wherein said means for securing the slip sheet to the slip sheet removal mechanism work in cooperation with said means for automatically positioning the stacks of plates so that the slip sheet on the top of the stack is in contact with said means for securing the slip sheet.

17. The apparatus according to claim 10, wherein said means for automatically separating and removing the single plate comprises:
  a. a carriage having means for attaching a plate to the carriage; and
  b. means for moving the carriage between the stack of plates in the access position and out of the plate handler.

18. The apparatus according to claim 15, wherein the means for preventing the slip sheet from sticking to the bottom of the single plate comprises a means for holding the slip sheet against the top of the stack of plates by pivoting a finger member into a holding position while the single plate is transferred out of the plate handler.

19. The apparatus according to claim 18, wherein said means for automatically positioning the stack of plates works in cooperation with said means for holding the slip sheet against the top of the stack of plates by moving away from the access position as the single plate is transferred out of the plate handler and as the finger member is in the holding position.

20. An apparatus for automatically selecting a plate for imaging in an automated plate handler and for removing a slip sheet from the plate handler, comprising:
  a. at least one suction tube mounted on a first pivoting shaft mounted for rotation in a bracket secured to the plate handler, said suction tube for attaching to a slip sheet on the top of a stack of plates in the plate handler in a first position;
  b. at least one finger member mounted on a second pivoting shaft mounted for rotation in the bracket, said finger member holding down the slip sheet to the stack of plates in a holding position and allowing the suction tube to lift the slip sheet from the stack of plates when the shaft is pivoted to a retracted position;
  c. at least one nip wheel mounted on a third pivoting shaft mounted for rotation in the bracket; and
  d. a driven roller supported for rotation in the bracket, said nip wheel pivotable to be in rolling contact against said driven roller in order to transfer the slip sheet between the nip wheel and the driven roller and thereby remove the slip sheet completely from the stack of plates.

* * * * *